(12) United States Patent
Aubauer et al.

(10) Patent No.: US 10,352,976 B2
(45) Date of Patent: Jul. 16, 2019

(54) MATRIX ELECTRODE DESIGN FOR THREE-DIMENSIONAL E-FILED SENSOR

(71) Applicant: Microchip Technology Incorporated, Chandler, AZ (US)

(72) Inventors: Roland Aubauer, Wessling (DE); Claus Kaltner, Unterbachern/Bergkirchen (DE); Lucian Rosca, Munich (DE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 648 days.

(21) Appl. No.: 14/197,507

(22) Filed: Mar. 5, 2014

(65) Prior Publication Data

US 2014/0267155 A1 Sep. 18, 2014

Related U.S. Application Data

(60) Provisional application No. 61/801,018, filed on Mar. 15, 2013.

(51) Int. Cl.
*G01R 27/26* (2006.01)
*G06F 3/041* (2006.01)
*G06F 3/044* (2006.01)
*G06F 3/046* (2006.01)

(52) U.S. Cl.
CPC ......... *G01R 27/2605* (2013.01); *G06F 3/044* (2013.01); *G06F 3/046* (2013.01); *G06F 3/0416* (2013.01); *G06F 2203/04101* (2013.01)

(58) Field of Classification Search
CPC ..... G01R 27/2605; G06F 3/044; G06F 3/045; G06F 3/0412
See application file for complete search history.

(56) References Cited

U.S. PATENT DOCUMENTS 8,674,956 B2 3/2014 Sumi et al. ............ 345/173
9,052,785 B2 6/2015 Horie
(Continued)

FOREIGN PATENT DOCUMENTS

DE 102008036720 A1 2/2011 ............ G01V 3/12
JP 2004088218 A 3/2004 ............ H01Q 1/38
(Continued)

OTHER PUBLICATIONS

"MGC3130: Single-Zone 3D Gesture Controller Data Sheet," Microchip Technology Incorporated, 40 pages, Nov. 19, 2013.
(Continued)

*Primary Examiner* — Alexander Eisen
*Assistant Examiner* — Mansour Said
(74) *Attorney, Agent, or Firm* — Slayden Grubert Beard PLLC

(57) ABSTRACT

An electrode arrangement has a transmitting electrode configured to generate a quasi-static alternating electric field which extends into an observation area, a first electrode extending in a first direction and configured to be connected to an evaluation device as a receiving electrode, and a second electrode extending in a second direction different from the first direction wherein for evaluating disturbances of the quasi-static alternating electric field an enhanced sensitivity profile is obtained by combining the first and second electrode.

32 Claims, 14 Drawing Sheets

(56) References Cited

U.S. PATENT DOCUMENTS

| | | | |
|---|---|---|---|
| 2010/0090712 A1* | 4/2010 | Vandermeijden | G06F 3/0416 324/658 |
| 2010/0096193 A1* | 4/2010 | Yilmaz | G06F 3/044 178/18.06 |
| 2011/0242028 A1* | 10/2011 | Lee | G06F 3/0418 345/173 |
| 2012/0044198 A1 | 2/2012 | Chai et al. | 345/174 |
| 2012/0229417 A1* | 9/2012 | Badaye | G06F 3/0416 345/174 |
| 2012/0293491 A1* | 11/2012 | Wang | G06F 3/044 345/419 |
| 2012/0313852 A1 | 12/2012 | Ivanov | 345/158 |
| 2013/0050092 A1 | 2/2013 | Ivanov | 345/168 |
| 2013/0147833 A1* | 6/2013 | Aubauer | G06F 3/0416 345/619 |
| 2013/0176236 A1* | 7/2013 | Ivanov | G06F 3/044 345/173 |
| 2013/0300706 A1* | 11/2013 | Tun | G06F 3/0412 345/174 |
| 2014/0049271 A1* | 2/2014 | Trend | G01R 27/2605 324/663 |
| 2015/0041301 A1* | 2/2015 | Lee | G06F 3/044 200/5 R |
| 2015/0227252 A1 | 8/2015 | Ivanov et al. | 345/174 |

FOREIGN PATENT DOCUMENTS

| | | | |
|---|---|---|---|
| TW | 201250561 A | 12/2012 | G06F 3/044 |
| TW | 201250566 A | 12/2012 | G06F 3/033 |
| WO | 2011/098281 A2 | 8/2011 | G06F 3/01 |
| WO | 2012/130476 A1 | 10/2012 | G02F 1/133 |

OTHER PUBLICATIONS

International Search Report and Written Opinion, Application No. PCT/US2014/022177, 12 pages, dated Jun. 24, 2014.

European Office Action, Application No. 14715172.4, 3 pages, dated Apr. 26, 2017.

Chinese Office Action, Application No. 201480015517.6, 5 pages, dated Jul. 16, 2018.

Taiwan Office Action, Application No. 103109321, 12 pages, dated Sep. 27, 2017.

Japanese Office Action, Application No. 2016500909, 7 pages, dated Dec. 4, 2017.

Chinese Office Action, Application No. 201480015517.6, 5 pages, dated Dec. 5, 2017.

* cited by examiner $r_1 \neq r_2$
Here: r1 > r2

MATRIX ELECTRODE DESIGN FOR THREE-DIMENSIONAL E-FILED SENSOR

CROSS-REFERENCE TO RELATED APPLICATIONS

This application claims the benefit of U.S. Provisional Application No. 61/801,018 filed on Mar. 15, 2013, which is incorporated herein in its entirety.

TECHNICAL FIELD

The present disclosure relates to three-dimensional electric field sensors.

BACKGROUND

A three-dimensional electric field sensor arrangement generally produces an electric field, for example, using a 100 kHz signal. Such an electric field extends vertically more than 10 cm from the device generating the field. A user can enter this field without touching the device, for example with a hand, and gestures performed by a user will disturb the electric field. Such distortions can then be measured and dynamic and static characteristic determined by the arrangement can be used to conclude which type of gesture has been performed.

FIG. 1 shows a typical electrode arrangement 100 that can be used to generate the quasi-static alternating electric near field and to detect disturbances in such a field. The electrode arrangement comprises a non-conductive substrate 130 that allows to arrange a receiving RX electrode 110 above a transmitting TX electrode 120. Here, a printed circuit board 130 may be used wherein the TX electrode 130 covers the entire bottom surface and a strip on the top surface forms one RX electrode 110. However, other arrangements may use multiple RX electrodes and may even employ multiple TX electrodes.

For example, FIG. 2 shows an exemplary arrangement of a printed circuit board 200 wherein a top layer comprises four RX electrodes 210, 220, 230, 240 arranged at the four edges of the printed circuit board 200. Furthermore, a center electrode 250 is arranged within the top layer in the area defined by the four RX electrodes 210, 220, 230, 240. The four RX electrodes 210, 220, 230, 240 may be solid copper strips whereas the center electrode may have a mesh or net structure as shown. The TX electrode as shown in this embodiment may also have mesh structure and may not necessarily be arranged on a bottom layer. As shown in FIG. 3, the printed circuit board 200 may be a multi-layer board and the TX electrode may be arranged in a middle layer and provide for cut out areas to allow placement of RX feeding lines. Moreover, a ground layer may be arranged on the bottom of the printed circuit board for example to provide shielding.

An example of an integrated circuit device that can be connected to such an electrode structure 200 is a gesture evaluation controller MGC3130 also called GestIC® manufactured by Applicant. Achievable range is the most critical factor in electric near field sensing and in GestIC® three-dimensional gesture recognition and tracking technology in particular.

SUMMARY

According to various embodiments, a method for optimizing the electrode design to achieve better electrode sensitivity profiles and thus significant larger range than before (up to 50%) is introduced. According to specific embodiments, a matrix electrode structure can be provided where the range of a three-dimensional electric near field measurement is improved by combining two or more electrode signals.

According to an embodiment, an electrode arrangement may comprise a transmitting electrode configured to generate a quasi-static alternating electric field which extends into an observation area, a first electrode extending in a first direction and configured to be connected to an evaluation device as a receiving electrode, a second electrode extending in a second direction different from the first direction, wherein for evaluating disturbances of the quasi-static alternating electric field an enhanced sensitivity profile is obtained by combining the first and second electrode.

According to a further embodiment, the first and second electrode can be combined by capacitively coupling the second electrode with the first electrode wherein the second electrode is electrically floating or has a high impedance. According to a further embodiment, the capacitive coupling can be realized by a discrete capacitor connected between the first and second electrode. According to a further embodiment, the capacitive coupling can be realized by a capacitive coupling path between the first and second electrodes. According to a further embodiment, the first electrode may generate a first receiving signal and the second electrode generates a second receiving signal and wherein the first and second signals are summed with controllable individual weights. According to a further embodiment, the transmitting electrode can be arranged in a layer under the first and/or second receiving electrode and being configured to generate the quasi-static electric field which is received by the first and second receiving electrodes. According to a further embodiment, the transmitting layer does only cover a partial area of the first and/or second electrode. According to a further embodiment, the electrode arrangement may further comprise a plurality of parallel arranged first electrodes comprising the first electrode, a plurality of parallel arranged second electrodes arranged perpendicular to the first electrode and comprising said second electrode, wherein first and second electrodes form a matrix. According to a further embodiment, the first and second electrodes can be arranged in different layers above the transmitting electrode. According to a further embodiment, each electrode may comprise a plurality of electrode segments connected in series. According to a further embodiment, each segment may have the shape of a diamond or the shape of a rhombus. According to a further embodiment, the first and the second electrodes may each be arranged in an interdigital structure. According to a further embodiment, the first and second electrodes each may comprise inner electrodes and outer electrodes, wherein the outer electrodes form receiving electrodes. According to a further embodiment, an outer electrode may be capacitively coupled with inner electrodes that are arranged perpendicular to the outer electrode wherein the capacitive coupling between electrode segments of the inner electrodes is different to the respective capacitive coupling between the electrode segments of the inner electrodes and the outer electrode. According to a further embodiment, adjacent electrode segments of said first and second electrodes may have a capacitive coupling defined by a distance between respective electrode segments and a first distance between the electrode segments of an outer electrode and the electrode segments of inner electrodes that are adjacent to the electrode segments of the outer electrode is different to a second distance between remaining adjacent electrode segments. According to a further embodiment, the first and second electrodes can be arranged in different layers above the transmitting electrode and wherein electrode segments of an outer electrode overlap partially with electrode segments of the inner electrodes being arranged perpendicular to the respective outer electrode. According to a further embodiment, the first and second electrodes may each comprise inner electrodes and outer electrodes, and wherein the outer electrodes form receiving electrodes and the inner electrodes are each formed by a plurality of electrode segments connected in series. According to a further embodiment, the first and second electrodes can be arranged in different layers above the transmitting electrode. According to a further embodiment, the electrode arrangement may further comprise floating electrode segments arranged in spaces defined by the matrix. According to a further embodiment, the transmitting electrode can be on the same layer as the first or the second electrodes and being configured to generate the quasi-static electric field which is received by the 1st and 2nd electrode. According to a further embodiment, the function of each electrode can be switched in runtime.

According to another embodiment, a system may comprise an electrode structure capable of evaluating three dimensional gestures and touching, comprising:—a controller having at least a first, second and third port, and wherein the electrode structure comprises:—a transmit electrode coupled with the first port; —a first electrode extending in a first direction and being coupled with the second port; and—a second electrode extending in a second direction different from said first direction and being coupled with the third port, wherein the second electrode is arranged with respect to the first electrode to provide for a capacitive coupling between the first and second electrode, wherein the controller is configured to operate in either a first or a second operating mode, and wherein in a first operation mode: the first port of the controller can be configured to drive the transmit electrode to generate an alternating electric field; the second port of the controller can be configured to connect the first electrode with a detection unit for evaluating a signal received from said transmit electrode; and the third port of the controller is configured to be in a high impedance state; and wherein in a second operation mode: the second and third port of the controller are configured to couple the first and second electrode with a capacitance measurement unit.

According to a further embodiment, the system may further comprise a plurality of third electrodes extending in the second direction. According to a further embodiment, the system may further comprise a plurality of second electrodes extending in the first direction, wherein first and second electrodes are arranged in a matrix. According to a further embodiment, the system may further comprise a multiplexer unit for selectively coupling one of the pluralities of second electrodes and one of the pluralities of third electrodes with said capacitance measurement unit when operating in said second mode. According to a further embodiment, the system may further comprise a multiplexer unit operable to either disconnect the pluralities of third electrodes from said controller or switch a ports connected with the pluralities of third electrodes into a high impedance state.

According to yet another embodiment, an electrode matrix structure for use in a three-dimensional positioning and gesture sensor arrangement and/or a projected capacitive touch sensor arrangement, may comprise:—a first layer comprising a transmit electrode; —a second layer comprising electrode elements arranged in a plurality of rows and columns, wherein the electrode elements of each row and each column are connected to each other such that each row and column define a separate electrode line, wherein the outer electrode lines define a left and right vertical electrode and a upper and lower horizontal electrode and wherein inner electrode lines formed by the inner rows and columns are arranged with respect to the left, right, upper, and lower horizontal electrodes such that the inner vertical electrode lines are capacitively coupled to the upper and lower electrodes to enhance the sensitivity of the upper and lower electrode lines and the inner horizontal electrode lines are capacitively coupled to the left and right electrodes to enhance the sensitivity of the left and right electrode lines.

According to a further embodiment of the electrode matrix, a distance between electrode segments of the left or right electrode line and adjacent segments of an inner horizontal electrode line or a distance between electrode segments of the upper or lower electrode line and adjacent segments of an inner vertical electrode line can be different, in particular greater or smaller, than a distance between adjacent electrode segments of the inner vertical and horizontal electrode lines. According to a further embodiment of the electrode matrix, each electrode of the matrix may be rhombus shaped or diamond shaped. According to a further embodiment of the electrode matrix, the electrode matrix may further comprise a third layer arranged between the first and second layer, wherein horizontal electrode lines are arranged in the second layer and vertical electrode lines are arranged in the third layer. According to a further embodiment of the electrode matrix, the electrode matrix may further comprise a third layer arranged between the first and second layer, wherein vertical electrode lines are arranged in the second layer and horizontal electrode lines are arranged in the third layer. According to a further embodiment of the electrode matrix, the electrode matrix may further comprise floating electrodes in spaces formed by said rows and columns.

According to yet another embodiment, an electrode matrix structure for use in a three-dimensional sensor arrangement, may comprise—first, second, third, and fourth strip shaped electrodes arranged to form a rectangle with an inner area, wherein each electrode is configured to be coupled with a receiver; —a floating center electrode which is arranged in the inner area and capacitively coupled with the first, second, third, and fourth electrodes to enhance sensitivity of the first, second, third, and fourth electrodes.

DETAILED DESCRIPTION

E-fields are generated by electrical charges and distributed three-dimensionally in space. GestIC® technology which has been developed by Applicant utilizes a self-generated quasi-static but alternating electrical field for sensing conductive objects, such as the human body, for example using a 100 kHz signal. For generating the E-field, a separate TX electrode layer is used. In case when a person's hand intrudes the electrical near field, it becomes distorted in a way that intercepted field lines are shunted to ground. In doing so, the three-dimensional electric field degenerates as a three-dimensional function. Applicant's GestIC® technology may use only four receive electrodes to detect the E-field variations at different positions and to determine the origin of the electric field distortion in all three dimensions. Applicant's MGC3130 chip can resolve capacitances below 1 fF (one femto Farad). The data sheet "Microchip MGC3130, Single-Zone 3D Gesture Controller Data Sheet", 2012, DS41667A, is available from Applicant's web page and hereby incorporated by reference. Determining the three-dimensional position of an object intruding the e-field, a minimum number of three receiving electrodes have to be used for trilateration. In GestIC® technology typically two pairs of electrodes (four) are used to calculate the x and y position of the field disturbing object separately from each other. One pair of electrodes is used to calculate the x position and the distance to the object (z position) and the other pair to calculate the y position. Techniques described in this disclosure apply to a minimum number of one receive electrode.

Figure 1:
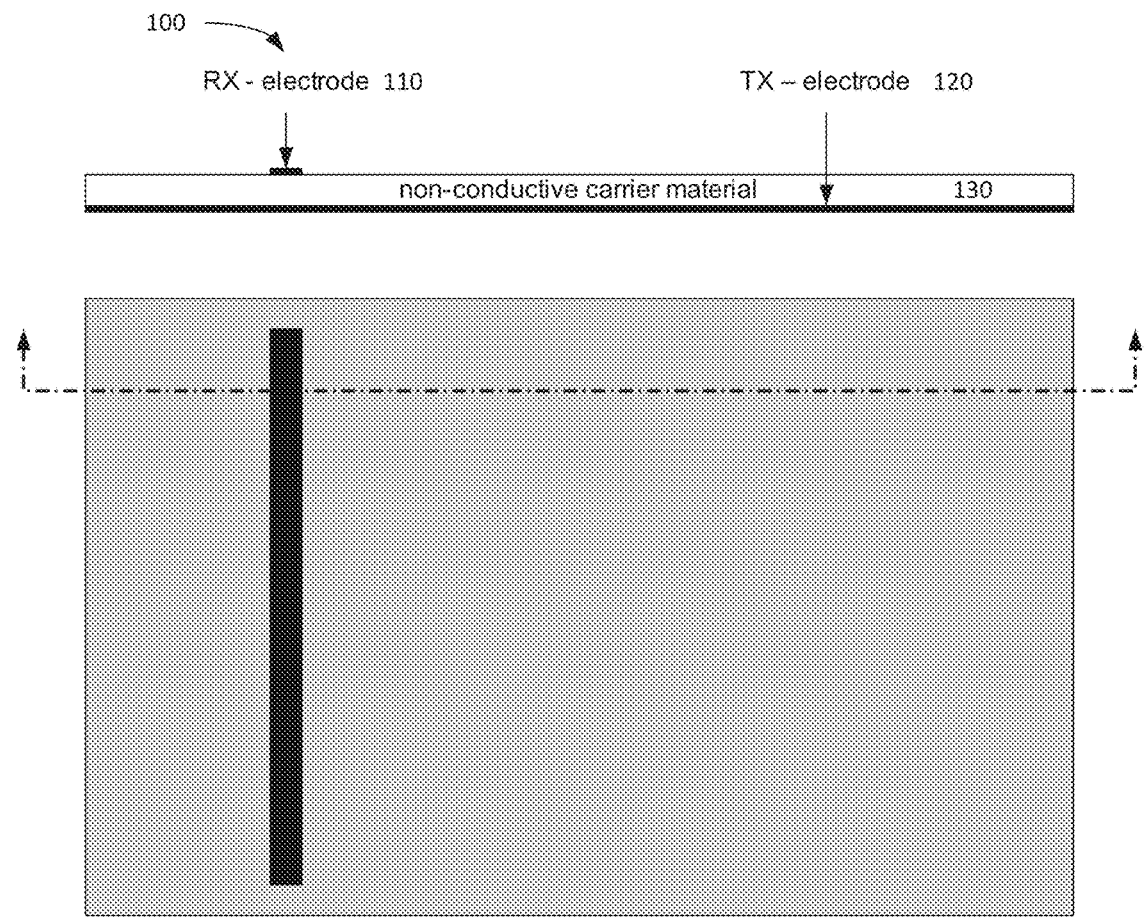
FIG. 1 shows a conventional electrode arrangement with a TX electrode and an RX electrode.
Figure 2:
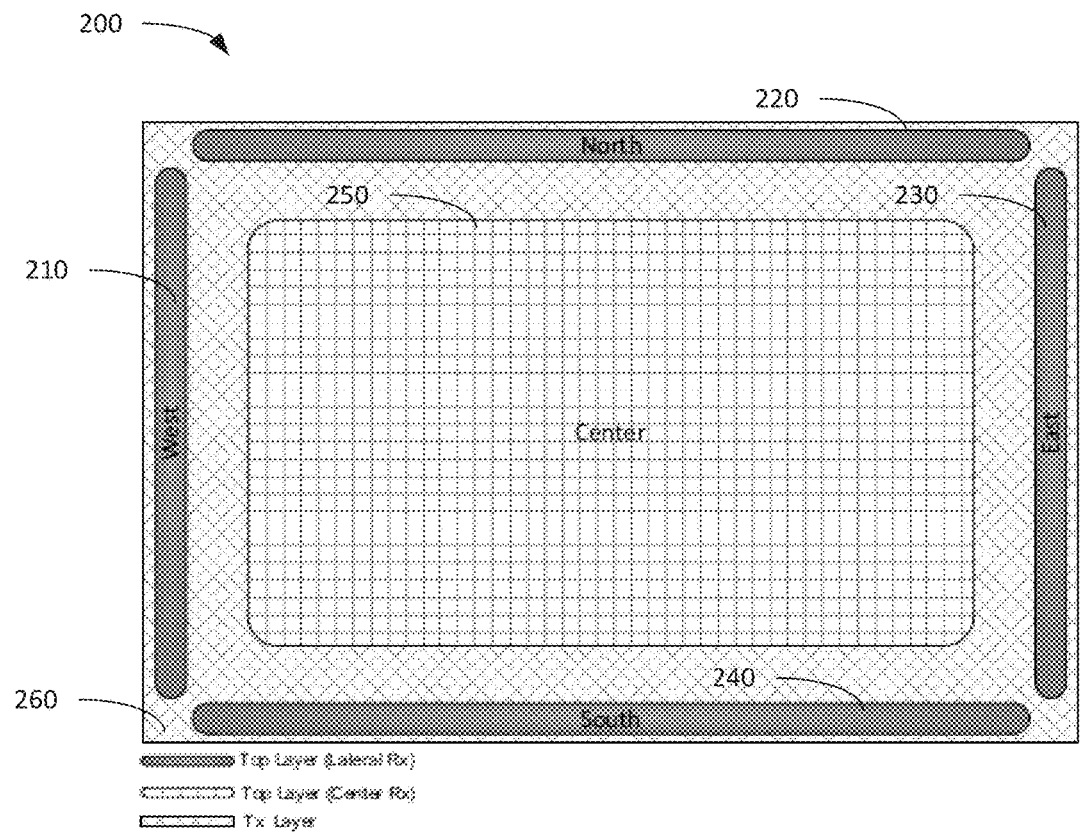
FIG. 2 shows a typical electrode arrangement on a printed circuit board with multiple electrodes.
Figure 3:
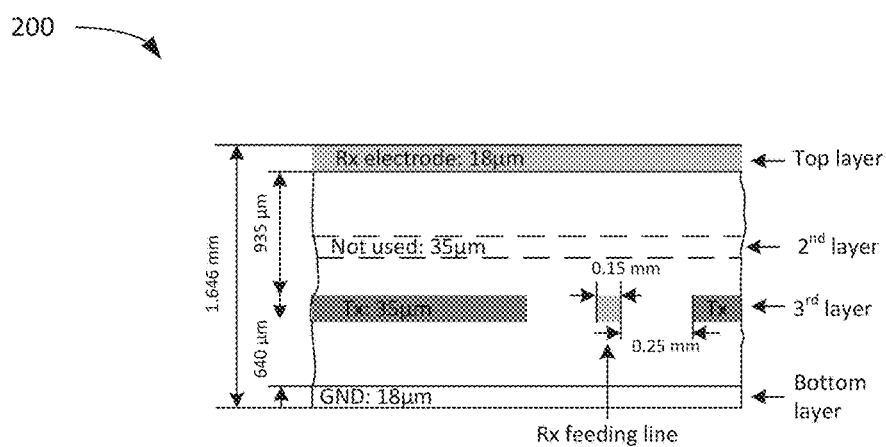
FIG. 3 shows a sectional view through a printed circuit board as shown for example in FIG. 2.
Figure 4A:
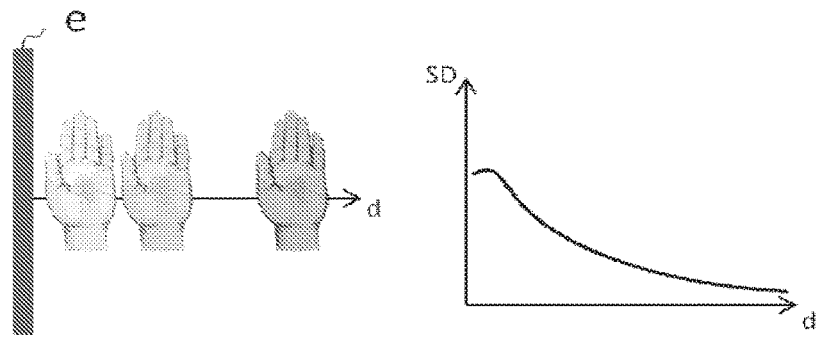
FIG. 4a shows a Sensitivity Profile (right) at hand movement perpendicular to the receiver electrode e (left).

It was shown in Mao Chundong's Master thesis "Weiterentwicklung eines Messsystems and Signalverarbeitung mit einem kapazitiven Handgestensensor" in 2010 that the measured E-field strength at a receiving electrode decreases approximately with a function proportional to $1/d^2$, where d is the distance of the E-field distorting grounded object (e.g. the user's hand) from the receiving measurement electrode. Basically the grounded hand shunts the generated E-Field partially to ground. FIG. 4a shows the sensitivity profile of the signal deviation SD over the distance d of the user's hand to the receive electrode. The signal deviation SD is here a measure for the delta signal of the measured E-field strength with and without the user's hand. For an accurate non jittery position tracking it is desirable to obtain a high SD level and a sufficient decline over distance. The $1/d^2$ decline makes a position tracking problematic for larger d, since the $1/d^2$ function becomes with distance flat very soon and position tracking becomes ambiguous. It is desirable to obtain an approximate constant decline of the signal deviation over distance to achieve good position tracking accuracy over distance from the electrode. This disclosure shows how the signal deviation function over distance can be controlled by combining the signals of more than one receiving electrode and thus achieving improved position tracking accuracy.

Figure 4B:
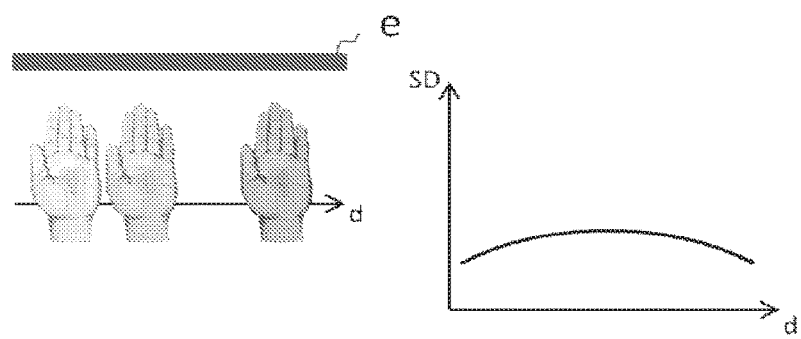
FIG. 4b shows a Sensitivity Profile (right) at hand movement parallel to the receiver electrode e (left).

Furthermore, to the $1/d^2$ function, the sensitivity profile of an object moving parallel to a linear electrode is known from unpublished U.S. patent application Ser. No. 13/778,394—"Method for Forming A Sensor Electrode For A Capacitive Sensor Device", filed Feb. 27, 2013 and assigned to Applicant and which is hereby incorporated by reference. FIG. 4b shows that the signal deviation reaches its maximum when the hand is in the middle of the electrode and decreases to both ends of the receiver electrode.

Figure 4C:
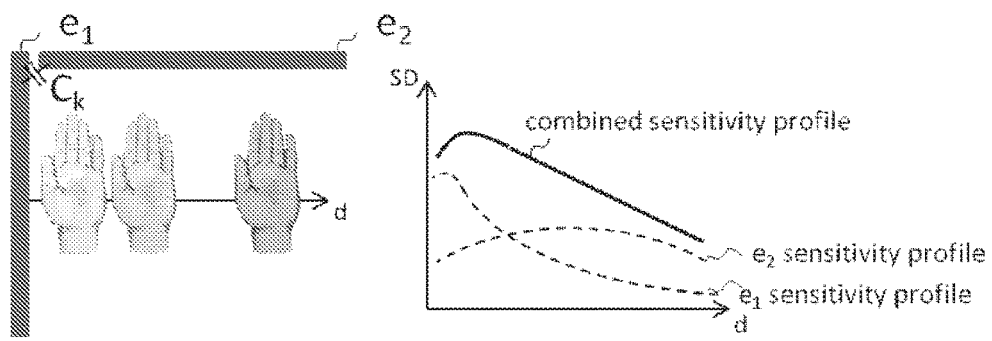
FIG. 4c shows a superimposed Sensitivity Profile (right) with one vertical and one horizontal receiver electrode.

In FIG. 4c it is shown that superposing the signals of both a vertical and horizontal electrode gives the desired slope of the signal deviation with an approximately constant decline over distance (for one distance of the hand to the horizontal electrode e2), when an optimum superposition of the electrode signals is chosen. The superposition can be either done:

i) on hardware level by capacitive or resistive coupling of the electrode signals, ii) in the analog front-end by summation amplifiers, where the signals of the receiving electrodes are summed with controllable individual weights with the signals of the "improving electrodes" or iii) in the digital signal processing domain. Same summation method as described in ii) but with the digitized signals.

FIG. 4c shows the capacitive coupling between both electrodes where the coupling capacitor determines the strength of the superposition. The capacitive coupling method (i) is the most simple and cost effective solution and further described below. The capacitive coupling can be realized:

a) By close arrangement of both electrodes (in the example of FIG. 4c in the upper left corner) and generating a capacitive coupling path with a capacitance CK, b) By introducing a discrete capacitor element CK.

Figure 4D:
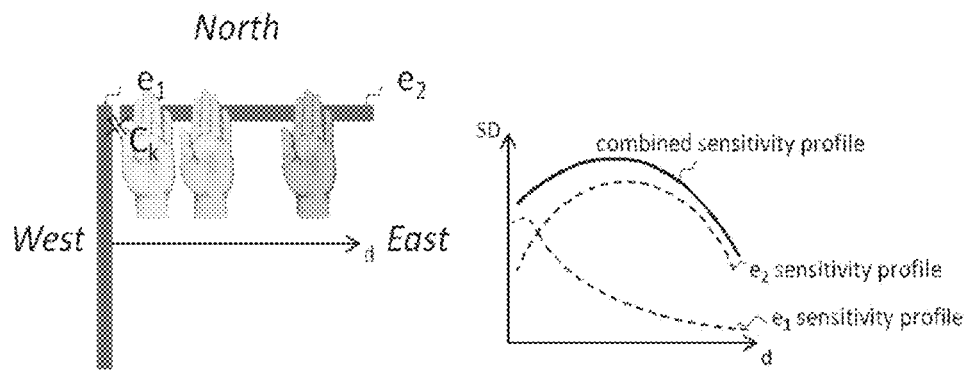
FIG. 4d shows a superimposed Sensitivity Profile (right) with one vertical and one horizontal receiver electrode. Dependency on hand position (South-North Direction)—compare with FIG. 4c.

Disadvantage of this (simple) solution with only one "improving" (horizontal) electrode is the dependency of the combined sensitivity profile on the distance of the hand to the horizontal electrode e2 (see FIG. 4d). When the hand is too close to the horizontal electrode e2 the combined sensitivity profile is "over-compensated" with a concave curve shape. The maximum of the over-compensated sensitivity profile is far inside the detection area and it is ambiguous if the user's hand is before or behind that maximum.

Figure 4E:
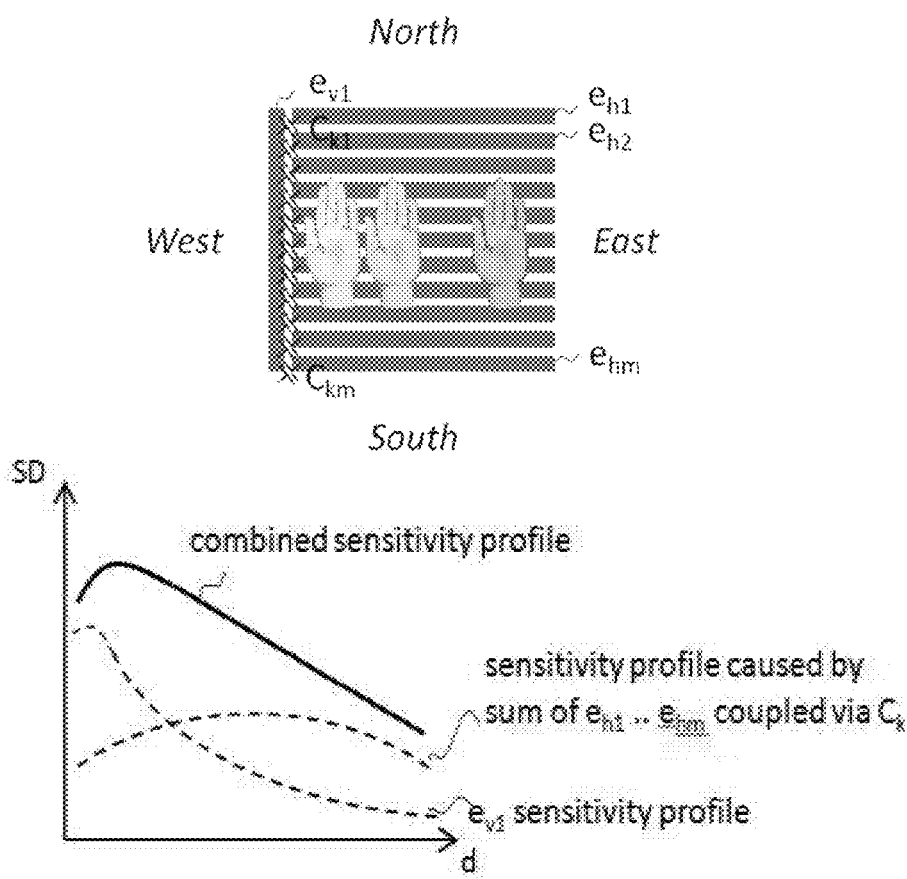
FIG. 4e shows a superimposed Sensitivity Profile (right) with one vertical and m horizontal electrodes to lower North-South dependency on hand position in West-East sensitivity profile.

FIG. 4e shows a solution how the compensation can be made approximately constant over the South-North position of the hand by introducing m horizontal "improving" electrodes $e_{h1}$ to $e_{hm}$ where those horizontal electrodes are capacitive coupled into the receiving West electrode $e_{vl}$. Optimum results are achieved by individual tuning of the coupling capacitances $C_{k1}$ to $C_{km}$ to the typical hand posture and to the horizontal "improving" electrodes in the respective application (e.g. it can be assumed that the hand is hold more or less flat and always comes from South direction in a keyboard application).

Figure 4F:
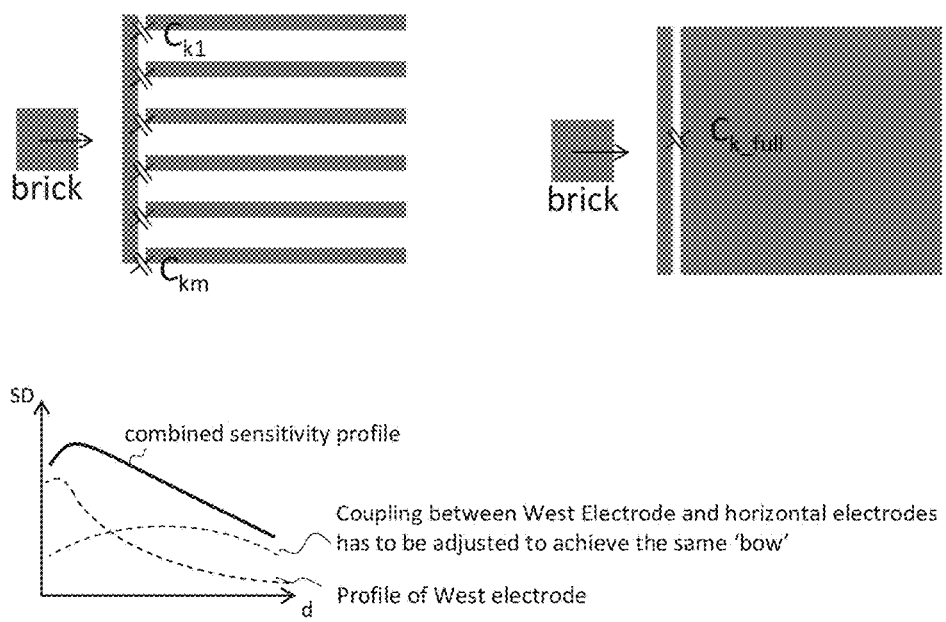
FIG. 4f shows another superimposed Sensitivity Profile (bottom) with one vertical and m horizontal electrodes or one vertical electrode and a single center electrode.

FIG. 4f shows a linearization of the sensitivity profile with horizontal stripes in comparison to a full copper center electrode. The full copper area shown on the right side of FIG. 4f is similar to a structure with diamonds set closely together as will be shown below. Instead of a hand as the object entering the electric field, FIG. 4f shows a so-called brick which can be a standardized rectangular brick shaped object, for example a Styrofoam brick covered with a copper foil can be used as a standardized hand simulating object. According to various embodiments, the receiving electrodes can be designed such that a "linear" sensitivity shape is created without any loss of sensitivity. In other words, a design of the receiving electrodes should comprise the benefits of the horizontal stripes electrodes shown on the left side of FIG. 4f, for example, the voltage profile obtained by the plurality of electrodes and the benefits of the full copper area $C_{k\_full}$ as shown on the right side, for example the stronger capacitive coupling between the West electrode and the full copper area.

As described in U.S. application Ser. No. 13/675,615 claiming priority to U.S. provisional application No. 61/609,538 and titled "SYSTEM AND METHOD TO SHARE ELECTRODES BETWEEN CAPACITIVE TOUCH CONTROLLER AND GESTURE DETECTION DEVICE", which has been assigned to Applicant which is hereby incorporated by reference in its entirety, systems and methods are available to use electrodes by a touch controller and a gesture detection system. Typically, a touch controller system determines by capacitive measuring methods (e.g. by self capacitance and mutual capacitance via non-differential/differential measurement) the coupling between horizontal and vertical electrode lines and thus can determine the touch position of one or multiple fingers by measuring the capacitive changes. A gesture detection system such as described in US Patent Application Publication US2012/0313852 claiming priority to DE 10 2008 036 720.6, titled "SENSOR SYSTEM FOR GENERATING SIGNALS THAT ARE INDICATIVE OF THE POSITION OR CHANGE OF POSITION OF LIMBS", which has been assigned to Applicant which is hereby incorporated by reference in its entirety, typically connects to the outer electrodes of the electrode matrix structure described in this patent application. Those electrodes may be shared or not shared with the touch controller.

Figure 5:
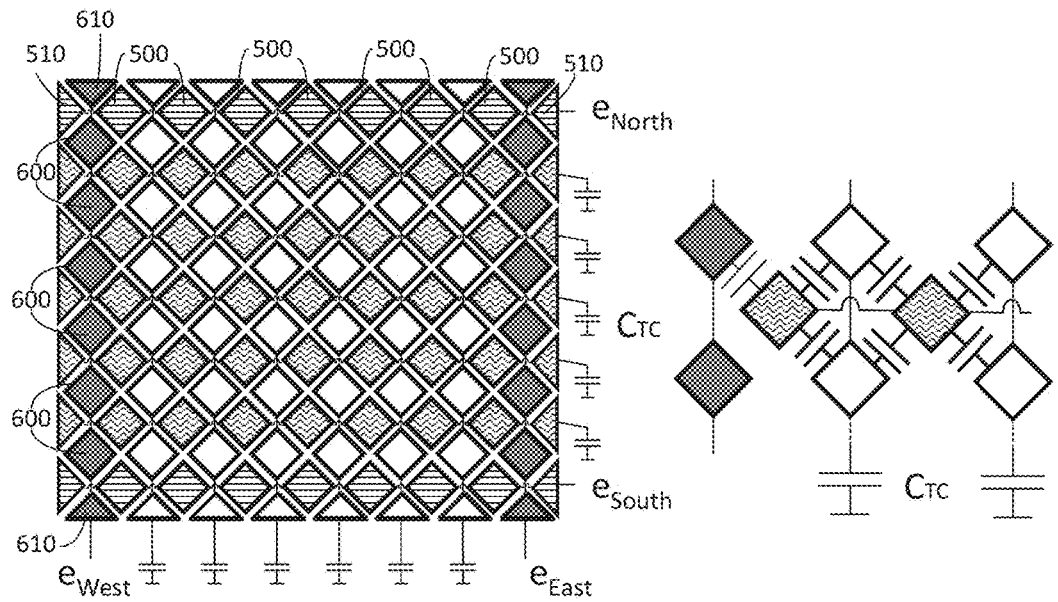
FIG. 5 shows matrix electrodes with diamond elements wherein inner electrodes are used to enhance sensitivity of outer electrodes at far distances (North, East, South, West).
Figure 7:
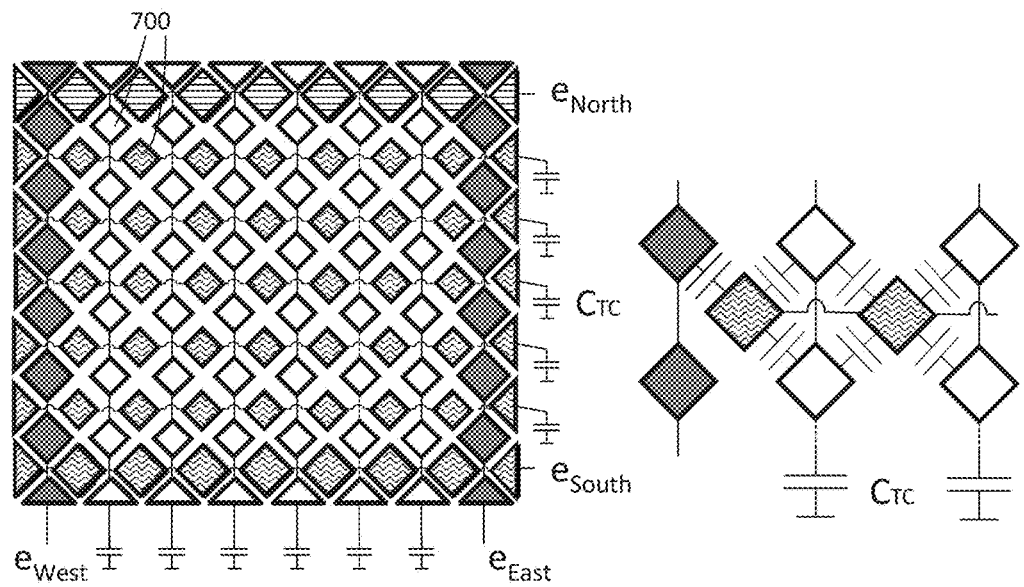
FIG. 7 shows matrix electrodes with smaller diamond shaped elements in the center area.

FIGS. 5 and 7 show embodiments of electrode segments arranged in a matrix. Such arrangements are often used in capacitive touch sensor devices as mentioned above. For example, such electrode segments can be arranged in a transparent layer to be used as a touch sensor over, for example, an LCD display. A touching changes the capacitive coupling of neighboring cells. By activating a single row or column, capacitive coupling of the sensor elements of the columns or rows can be detected. For example, one or more touch position can be determined by sequentially activating all rows and sequentially determining the couplings to the respective columns, or vice versa.

These type of touch sensor arrangements can also be used for a touchless gesture recognition as discussed above. To this end, the most outer electrode lines indicated as electrode lines $e_{West,\ East,\ North,\ South}$ can be used as electrode stripes as shown in an equivalent circuit in FIG. 6 wherein the inner electrode segments can be switched together to form a center electrode. In case no touch controller system is used the inner electrodes of the matrix structure described in FIGS. 5 and 7 may be floating electrodes. Floating means that those electrodes are not connected to any electrical circuit.

As shown in the embodiment of FIG. 5, horizontal and vertical electrode stripes are formed by horizontally or vertically arranged diamond shaped electrodes coupled in series respectively. Advantage of these electrode segments is that a very homogenous optical surface can be provided. While FIG. 5 shows connections to the series connected electrodes on the right side and the bottom of the matrix, according to another embodiment, the rows of horizontal lines can also each be connected alternatively on the left and right side, forming an inter-digital structure. Similar arrangements can be made for the vertical electrode lines with connections on the top and bottom side of the matrix.

There is a plurality of horizontally arranged sensor elements 500, 510 coupled in series that form horizontal electrode stripes. Similarly, there a plurality of vertically arranged electrode segments 600, 610 which are coupled in series to form vertical electrode stripes. Each electrode stripe, horizontal or vertical, can be individually selected by a respective multiplexer switching unit. For each horizontal row, for example $e_{North}$ and $e_{South}$ and rows that lie inbetween, the most left and the most right electrode segment may be designed as a half diamond 510, effectively having the shape of a triangle. Similarly, the top and bottom electrodes 610 of each column, e.g. $e_{West}$ and $e_{East}$ and any column inbetween, may have a similar shape. Thus, the entire matrix fills out a rectangle as shown in FIG. 5. The West and East electrodes are shown in FIG. 5 with electrodes segments 600, 610 filled grey whereas the inbetween columns are shown with white segments. The North and South horizontal electrode segments 500, 510 are marked with horizontal hatching whereas the segments of the rows arranged inbetween are shown filled with wavy lines. The specific capacitive couplings of some electrode segments next to the West electrode column are shown on the right in FIG. 5.

Figure 6:
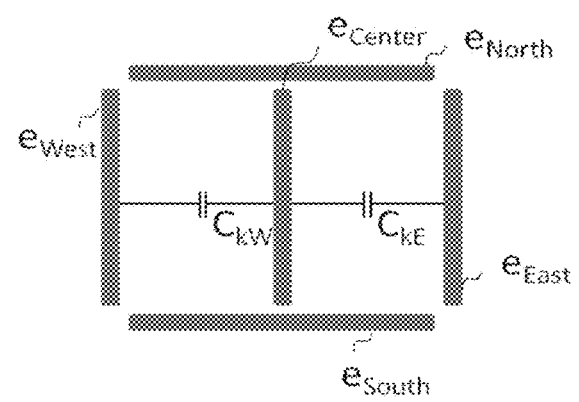
FIG. 6 shows frame electrodes with capacitive coupled vertical center electrode to enhance sensitivity of outer West and East electrodes at far distances.

FIG. 6 shows an exemplary use of electrode segments available in a matrix as provided by the sensor structure of FIG. 5 for use in a gesture recognition system according to various embodiments. FIG. 6 shows an option where the improving (center) electrode(s) do not necessarily need to be arranged perpendicular to the receiving electrodes. In this option a parallel center electrode was introduced in the middle of the West and East receiving electrodes. Coupling is done in this example again capacitively. Again, the North electrode $e_{North}$ and the South electrode $e_{South}$ are formed by the top and bottom electrode segments 500, 510 coupled in series, respectively. Similarly, the West and East electrodes $e_{West}$, $e_{East}$ are formed by the most left and right electrode segments 600, 610 coupled in series, respectively. The center electrode $e_{Center}$ can be formed by the center electrode segments shown in white or with wavy lines in FIG. 5. The closer the diamond electrode segments in the center area are, the more similar this arrangement is to the arrangement as shown on the right side of FIG. 4f which shows a full copper area as the center electrode.

FIG. 7 shows a similar arrangement as FIG. 5 wherein the size of the electrode segments 700 of the inner rows and columns are smaller in comparison to the embodiment shown in FIG. 5 and therefore generate a smaller capacitive coupling. Again the right side of FIG. 7 shows the capacitive coupling between the respective electrode segments. Thus, depending on the gap between these inner electrode segment and the surrounding electrodes $e_{West, East, North, South}$ a strong or weak capacitive coupling exists between the neighboring electrode segments.

In designing an electrode structure, the goal is to generate a "linear" sensitivity shape without loss of sensitivity. Thus, for example:
  the same bow as shown in the graph of FIG. 4f should be added to the profile of the West electrode $e_{West}$.
  The same voltage of the horizontal electrodes needs to be added.

With a given sensitivity profile of one gesture electrode, a certain voltage level of the signal bow must be added to get the best linearization. The voltage level which is added because of the presence of the 2nd electrode(s) depends on the coupling capacitance Ck and how sensitive the 2nd electrode is towards the hand. Because the surface area has an effect on the sensitivity, Ck has to be adapted according to the sensitivity of each electrode. Example in FIG. 4f: The 2nd electrode of FIG. 4f left is a stripe and generates a lower signal level than a full copper area as in FIG. 4f right. To superimpose the same voltage from the 2nd electrode to the RX-electrode, a full copper electrode needs a lower Ck than the sum of coupling capacitances necessary for a striped setup.

The stripes with smaller surface need stronger coupling->$\Sigma Ckn > C_{k\_full}$
with adjusted Ck, same TX Voltage is coupled->same sensitivity is expected
sensitivity could be affected by TC with different diamond spacings When there is a capacitive load like die input capacitance of a touch controller on each stripe, the sensitivity of the receiving-electrode will drop because the signal on each stripe electrode is reduced by the ground capacitance. For linearization, Ck may need to be increased to get the same signal voltage. With increased Ck, also the impedance of the receiving electrode is reduced (higher capacitive load) which leads to a lower sensitivity.

Figure 8:
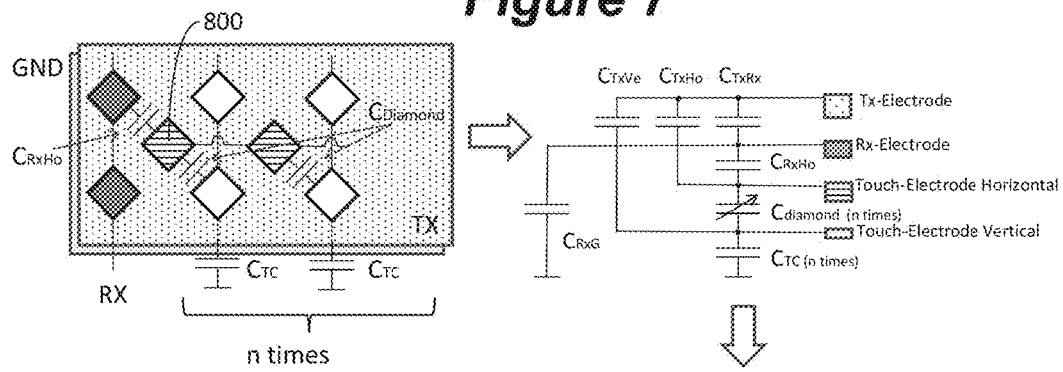
FIG. 8 shows equivalent circuits for some of the electrodes according to FIG. 7.
Figure 8:
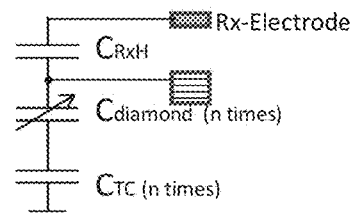

As shown in FIG. 8 in more detail, small gaps (with constant electrode area) cause strong coupling between horizontal and vertical lines. The smaller the gap, the higher is the negative influence of the Ground Capacitance of the Touch Controller. For example, each electrode segment 800 of a horizontal electrode stripe provides for a strong coupling between the respective horizontal and vertical lines. A detailed and simplified equivalent circuit is shown on the right side in FIG. 8.

The horizontal line is less sensitive to the hand. Therefore, CRxH must be increased to get the necessary voltage for the linearization effect. The RX to GND coupling is increased and thus becomes more insensitive. The usage of smaller gaps between horizontal and vertical lines therefore becomes beneficial. The same effect applies for the vertical lines and North/South electrodes.

Figure 9:
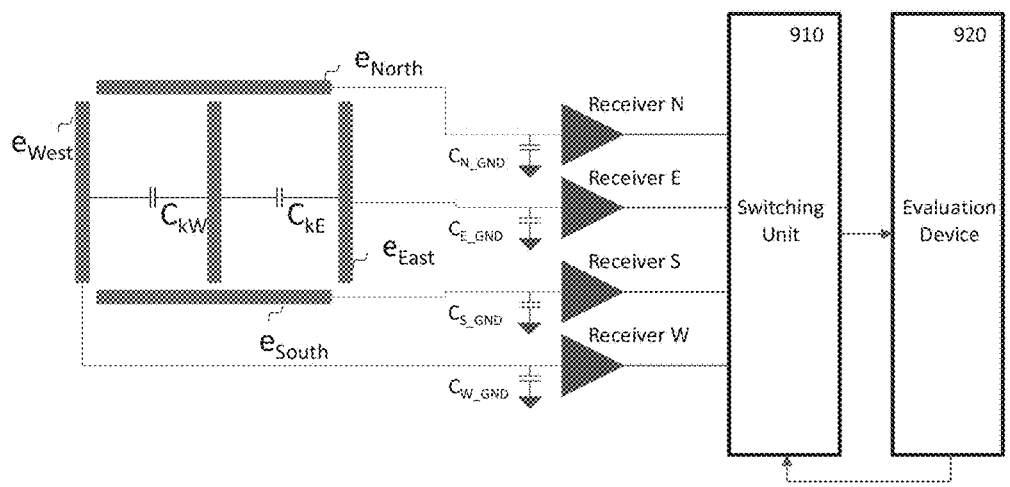
FIG. 9 shows frame electrodes with capacitive coupled vertical center electrode and attached receiver amplifiers.
Figure 10:
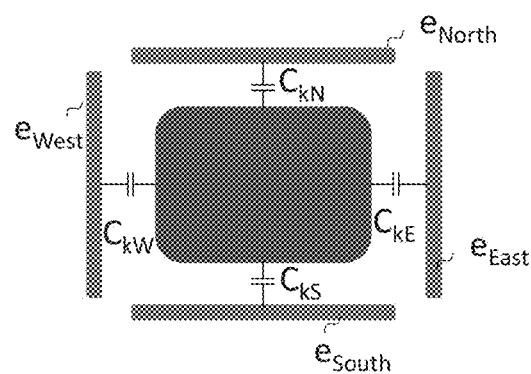
FIG. 10 shows frame electrodes with capacitive coupled rectangular center electrode to enhance sensitivity of all four outer electrodes at far distances (North, East, South, West).

FIGS. 9 and 10 show again a typical design and usage of the electrodes in a gesture detection system using quasi-static electric field evaluation. The figures do not show the transmitter electrodes which is usually arranged below the receiver electrode structure as shown in FIGS. 9 and 10 and may cover the entire receiver electrode area. FIG. 9 shows in addition the receiver input circuit with the respective input capacitance $C_{D\_GND}$ (D stands here for the direction North, East, South, West). The optimum couple capacitance $C_{KD}$ is determined by the receiving electrode capacitances to the transmit electrode which as mentioned above is typically a large electrode underneath the receiving electrode structure (not shown in FIG. 9), the receiving electrode capacitances to ground and the receiver circuit input capacitances $C_{D\_GND}$. This applies to all introduced electrode designs of this disclosure. The various signals generated by the receiving electrodes $e_{West, East, North, South}$ can be fed to a switching unit 910 coupled with an evaluation device 920. The switching unit allows for sequential analysis of the various electrode signals. Such a switching unit 910 can be a sample & hold unit with a multiplexer as typically used in analog-to-digital conversion (ADC) units of microcontrollers. However, such a unit could also be omitted if multiple ADC unit are available.

Figure 11:
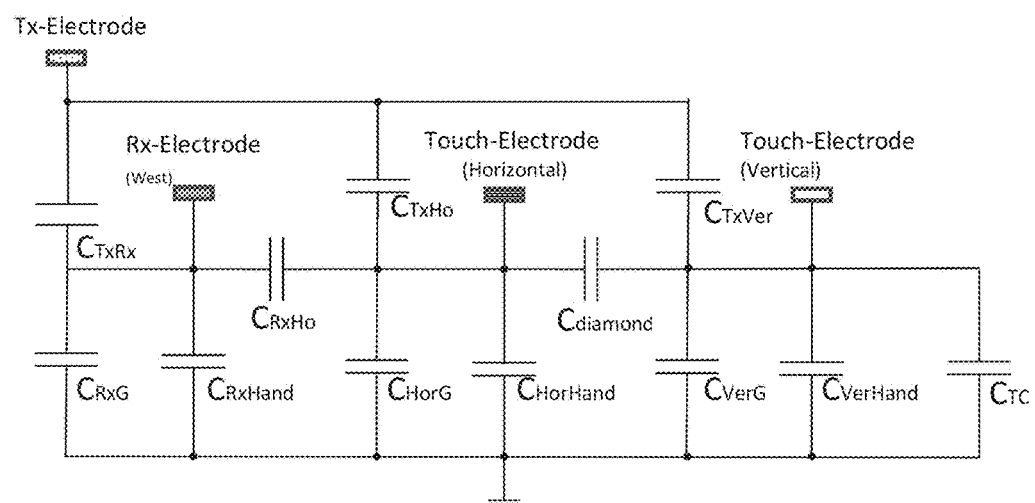
FIG. 11 shows an equivalent circuit diagram of an arrangement with Tx, Rx, and horizontal and vertical touch electrodes.

FIG. 9 shows the coupling of the individual receiving electrodes with respective amplifiers, preferably high impedance amplifiers of the gesture detection system. FIG. 10 shows an arrangement in which a large center electrode is formed in particular by the inner horizontal and vertical touch electrode segments. FIG. 10 shows therefore a plate center electrode that can be used as the range improving electrode structure. The center electrode can be bound capacitive to all four receiving electrodes as shown. Again alternatively with a fifth input channel the superimposition can be also be realized in analog circuitry or in the digital signal processing domain. FIG. 11 shows an equivalent circuit of such an electrode structure.

Figure 12A:
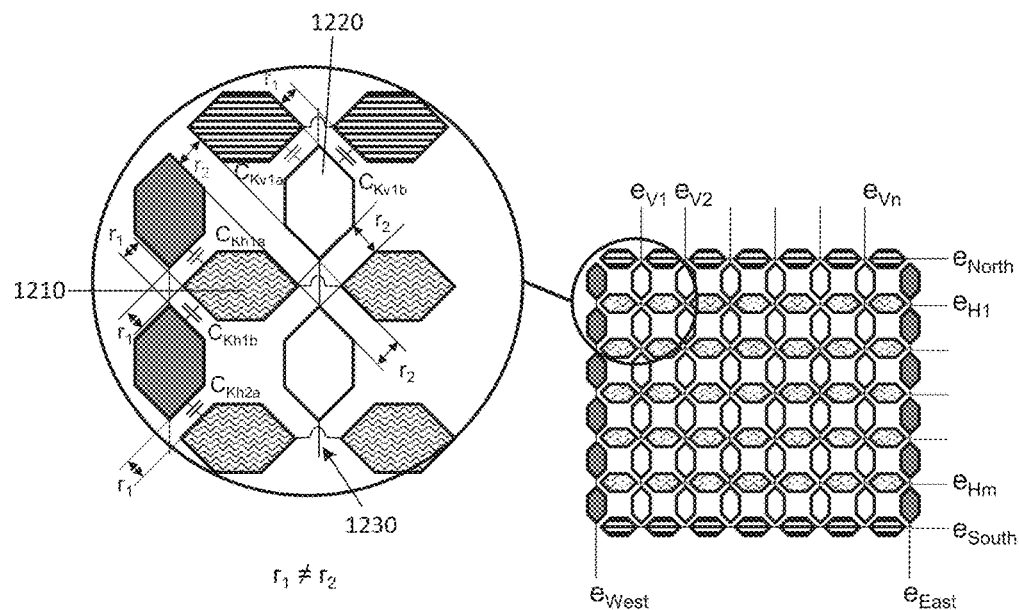
FIG. 12a shows matrix electrodes with rhombus elements where inner electrode lines (in white and wavy lines) are used to enhance sensitivity of outer electrodes at far distances (North, East, South, West).

As mentioned before typically four receiving electrodes are used to determine position by trilateration. FIG. 12a (right side) shows how the embodiment presented in FIGS. 4e and f can be generalized into a matrix structure with horizontal and vertical electrodes and transferred to a four RX electrode frame design. Horizontal electrode elements (here rhombus shape) in wavy lines or hatched are connected via different line structures $r_1$ to each other same as the vertical electrode elements in dark gray or white. As mentioned above, one line of horizontal or vertical electrode elements give one linear electrode. Receiving RX electrodes are the outer "frame" electrode lines—West and East electrode in dark gray, North and South electrode in hatched style. The range and sensitivity profile of West and East electrodes are improved by the horizontal electrodes in wavy style which are capacitively coupled to the respective West and East electrodes $e_{West}$, $e_{East}$. The range and sensitivity profile of North and South electrodes $e_{North}$, $e_{South}$ are improved by the vertical electrode segments shown in white. The enlargement in FIG. 12a shows how the specific coupling is realized by arranging the respective segments of the inner horizontal electrode segments 1210 in this example closer to the respective segments of the West and East electrode $e_{West}$, $e_{East}$. Distance $r_1$ is therefore smaller than the general distance $r_2$ between the segments. The same arrangement is made with respect to the inner vertical electrode segments 1220. The same adjustment was done in FIG. 12c, whereas here, the distance r1 was increased with respect to r2 to achieve a linearization effect. In particular the rhombus shape of the various electrode segments is beneficial for allowing to adjust the capacitive coupling through the placement of the edges of the inner horizontal electrode segments in parallel to the neighboring edges of two consecutive vertical electrode segments as shown with inner segment 1210 in FIGS. 12a and 12c. It is to be noted that r2 indicates the general distance between the electrode segments and the distance r1 is only used for those segments that are adjacent to one of the four main receiving electrodes $e_{North}$, $e_{South}$, $S_{West}$, $e_{East}$.

FIG. 12a (left side) shows that the capacitive coupling between the improving electrode lines in the center (wavy or white) and the outer frame electrodes can be controlled by the distance r1 between the electrode elements. Generally, distance $r_1$ determining the coupling of the inner electrodes to the outer frame electrodes is different from distance $r_2$ determining the coupling of the inner vertical and horizontal electrodes considering application specific optimization of touch and 3D positioning and 3D gesture. Horizontal and vertical electrodes can be on one layer but also in two different layers. In case horizontal and vertical electrodes are in one layer bridges 1230 on the interconnecting lines must be used to separate horizontal and vertical structures.

Figure 12B:
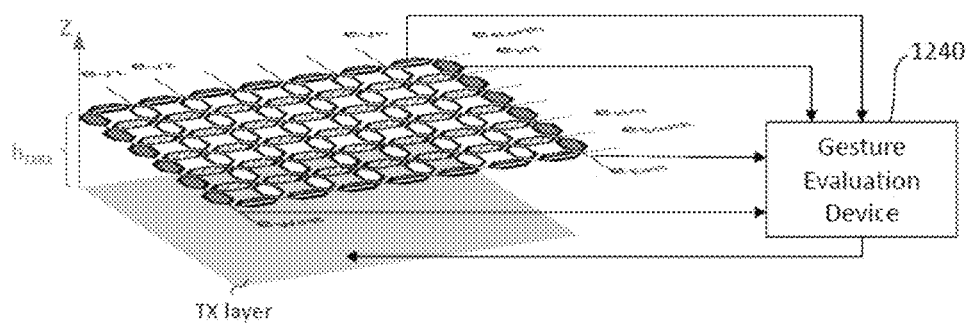
FIG. 12b shows matrix electrodes with rhombus elements where receive electrodes are arranged in one layer. The second TX transmit layer is in light gray.

FIG. 12b shows a perspective view of the receiving electrode segments with respect to their arrangement in three-dimensions according to one embodiment. FIG. 12b, shows therefore a setup where vertical and horizontal RX receiving electrodes are within one layer. The distance to the TX signal transmission layer, that generates the electric field, is given by $h_{TXRX}$.

FIG. 12b also shows the typical connection of the electrodes in a system. A gesture evaluation device 1240 has four inputs and an output. The inputs are connected with the receiving electrodes $e_{North}$, $e_{south}$, $e_{West}$, $e_{East}$ and the output is connected with the transmitter electrode. For a gesture evaluation system, the remaining vertical and horizontal electrodes are not connected to the evaluation device 1240. However, such a connection can be provided in combined system that uses the electrode matrix for both touch and gesture detection. During a gesture mode, only the electrodes $e_{North}$, $e_{south}$, $e_{West}$, $e_{East}$ and the transmitting electrode would be connected whereas the remaining connection would be switched to a high impedance thereby allowing these electrodes to float for purposes of the profile enhancements as discussed in this disclosure. During a touch mode operation the respective segments need to determine a touch would be activated by a switch matrix as known in the art.

Figure 12C:
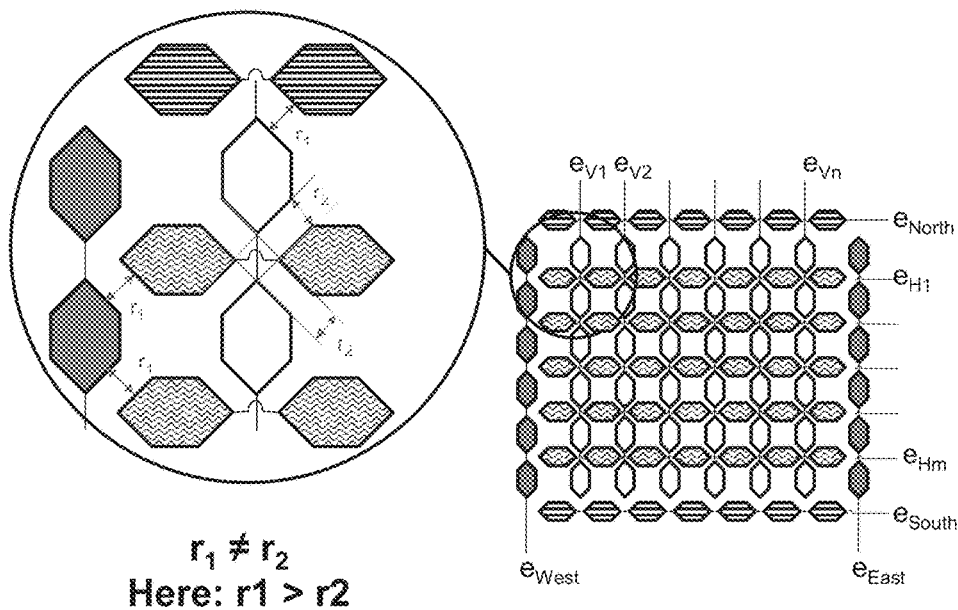
FIG. 12c shows another embodiment in which the distance of the outer electrodes to the inner electrodes was adjusted for a better linearization of the sensitivity profile by increasing the distance.
Figure 12D:
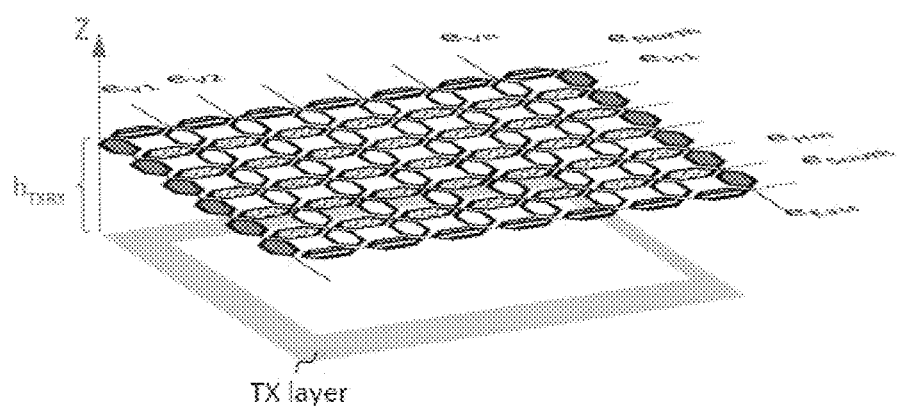
FIG. 12d shows another embodiment similar to the embodiment shown in FIGS. 12a-12c wherein the transmitting electrode does only cover partial area of the first and/or second electrode.

FIG. 12d shows another embodiment similar to the embodiments shown in FIGS. 12a-c wherein the transmitting electrode does only cover partial area of the first and/or second electrode. Thus, the transmitting electrode may be shaped like a frame.

Figure 13:
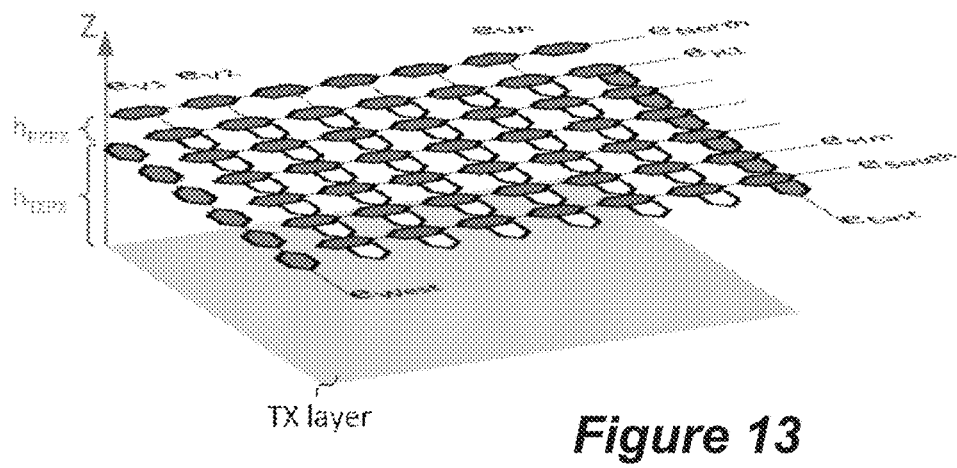
FIG. 13 shows matrix electrodes with rhombus elements where receive electrodes are arranged in two different layers. Layer 1 (dark gray and white) with vertical aligned electrodes. Layer 2 (dark gray and light gray) with horizontal aligned electrodes. The third TX transmit layer is in light gray.

FIG. 13, shows a setup where vertical RX receiving electrodes $e_{West}$, $e_{East}$, and horizontal RX receiving electrodes $e_{North}$, $e_{south}$ are on two different layers, separated by a distance $h_{RXRX}$. The distance to the TX signal transmission layer, that generates the electric field, is given by $h_{TXRX}$.

Figure 14:
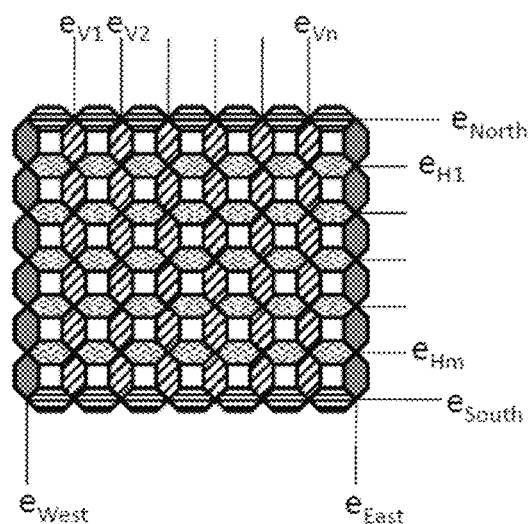
FIG. 14 shows matrix electrodes with no interconnection lines between rhombus elements in two layer RX design. Layer 1 (dark gray and white diagonal striped rhombus) with vertical aligned electrodes. Layer 2 (hatched and wavy electrodes) with horizontal aligned electrodes. The third TX transmit layer is in light gray.
Figure 14:
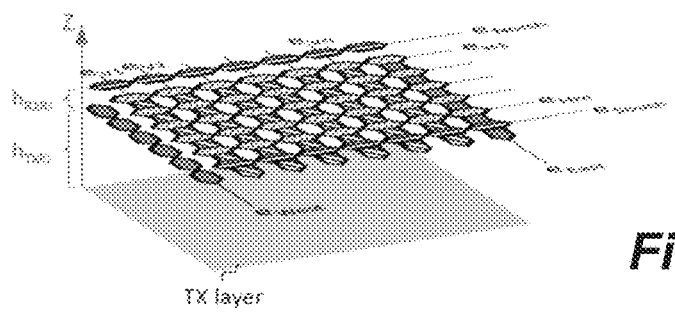

FIG. 14 shows the same setup as FIG. 13, but without interconnection lines between the rhombus electrode elements since vertical and horizontal electrodes are on two different layers and no interconnection bridges are required. Here the tips of each rhombus joins the tip of the adjacent segment. Thus, continuous electrode stripes are formed by the plurality of segments arranged in a vertical or horizontal line.

Figure 15:
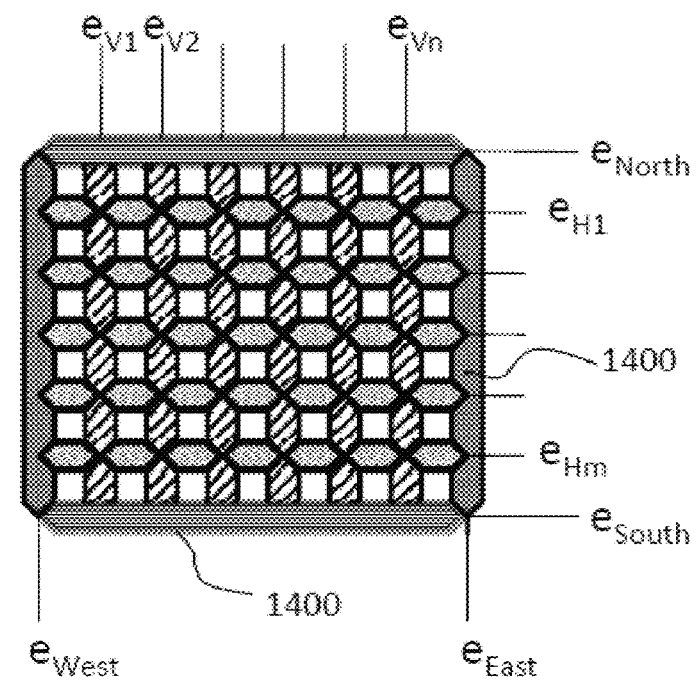
FIG. 15 shows matrix electrodes with rhombus elements in two layer RX design, where outer receiving electrodes in dark gray and hatched (North, East, South, West) partly overlap in z-direction with inner electrodes which are used to enhances sensitivity over distance. Layer 1 (dark gray and diagonal striped rhombus) with vertical aligned electrodes. The wavy inner electrodes are drawn transparent to visualize the overlapping with the receiving East and West electrodes. Layer 2 (hatched and wavy electrodes) with horizontal aligned electrodes. The hatched North and South receiving electrode are drawn transparent to visualize the overlapping. The third TX transmit layer is in light gray.
Figure 15:
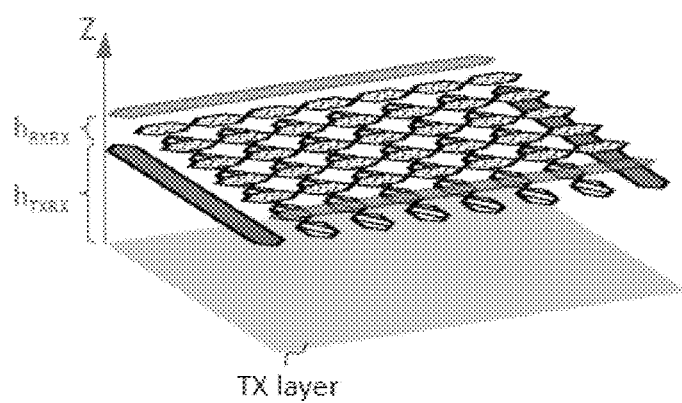

FIG. 15 shows a possibility where the capacitive coupling of the receiving RX electrodes with the improving center electrodes is done by partial overlapping of vertical and horizontal electrodes wherein the overlapping elements are in different layers. In this example the overlap was accomplished by replacing the single rhombus segments that form the respective RX electrodes $e_{North}$, $e_{south}$, $e_{West}$, $e_{East}$ by one large RX rhombus line element 1400, respectively. As six (6) rhombus segments form a vertical electrode stripe, and seven (7) rhombus segments form a horizontal electrode stripe, the respective six or seven segments in the matrix are replaced by one single large electrode $e_{North}$, $e_{South}$, $e_{West}$, $e_{East}$ as shown in FIG. 14. Many other methods how to overlap areas are possible. The coupling capacitance CK can be controlled in this case by changing the size of overlap area.

Figure 16:
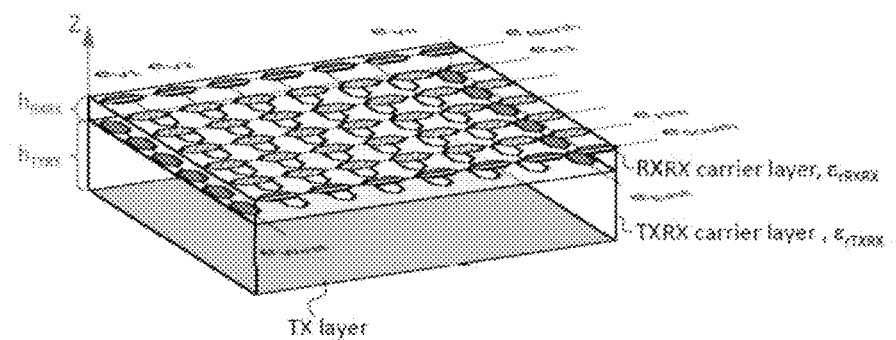
FIG. 16 shows matrix electrodes with rhombus elements in two layer RX design, where outer receiving electrodes in dark gray and hatched (North, East, South, West) partly overlap in z-direction with inner electrodes which are used to enhance sensitivity over distance. RXRX carrier layer with $\varepsilon r_{RXRX}$. TXRX carrier layer with $\varepsilon r_{TXRX}$.

In case of two layers, the RX layers are separated with a non-conductive material (separating RXRX carrier layer) such as printed circuit boards PCB, plastic (e.g. poly carbonate (PC), PC-ABS, PET (Polyethylene terephthalate), acrylic glass (Plexiglas)), glass, etc. Simultaneously, the TX and RX layer are also separated with a non-conductive material (separating TXRX carrier layer), see FIG. 16. According to an embodiment, the carrier layer thickness $h_{TXRX}$ is as small as possible in order to achieve most similar sensitivities of horizontal electrodes and vertical electrodes to the target object (e.g. the user's hand). The relative permittivity of the TXRX carrier layer or $\varepsilon_{TXRX}$ should be as small as possible to decouple the RX electrode as much as possible from the TX electrode to enable maximum sensitivity at a given TXRX carrier layer thickness of $h_{TXRX}$.

Consequently both carrier layers are of the same low permittive materials to achieve best results. A good transparent material would be e.g. Polycarbonate or PET with an $\varepsilon_r \approx 2$-3. Nevertheless, the best option is to use only one RX-layer for best sensitivity and similar performance of horizontal and vertical electrodes.

Figure 17:
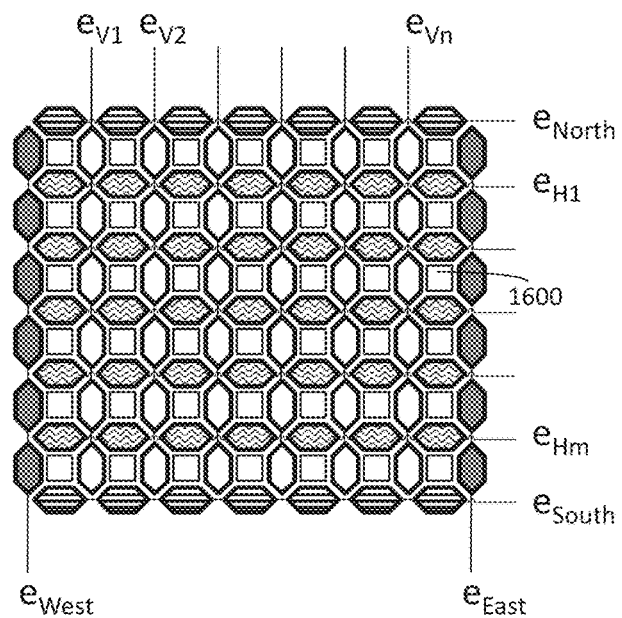
FIG. 17 shows another embodiment in which additional floating square shaped electrodes are placed in the areas between the rows and columns.

FIG. 17 shows yet another embodiment in which additional floating square shaped electrodes 1600 are placed in the areas between the rows and columns. FIG. 17 shows that additional floating electrode structures can be introduced, e.g. to obtain an as much as possible homogenous optical surface that is important not only for display applications.

The embodiments discussed above give examples how the electrode elements can be designed (e.g. rhombus or diamond shape, etc.). Many different designs are possible.

In summary, the wavy line filled horizontal electrodes $e_{H1}$ to $e_{Hm}$ are used simultaneously to enhance the distance range of the West and the East electrode and to optimize both sensitivity profiles (linear decrease). Same capacitive coupling techniques or analog front-end or digital signal processing techniques as described before can be used to superimpose the signals on the electrodes. Most simple is the capacitive coupling method as shown in FIGS. 4c and 12a between the individual wavy horizontal electrode lines and the gray receiving electrodes (West and East) wherein in this case the improving (wavy line filled horizontal) electrodes can be floating and must not be connected to a signal acquisition system. In order to get a large detection area, the sensitivity profile is linearized by adjusting the distance r1, which leads to different distances r1 and r2.

In case of a combined touch panel/touch screen solution the improving electrodes can also be connected to a separate touch controller or to the inputs of a combined 3D gesture tracking and recognition touch controller device (or integrated circuit). In such a case it must be ensured that the receiving channels of such a touch controller must be high impedance as shown in FIG. 9, e.g. the input capacitance should be below 1, 3, 5, 10 pF depending on the general electrode sizes. The white vertical electrodes $e_{V1}$ to $e_{Vn}$ can be used to enhance the distance range of the North and the South electrodes, respectively.

It is to be noted that the various features of the different embodiments can be freely combined. For example shapes defined in one embodiment may also apply to other embodiments. Circuit structures such as but not limited to the controller can be used with other embodiments. The structural arrangement of the electrode arrangement of one embodiment may also apply to other embodiment such as the system embodiments. Other combinations of features may be possible.

What is claimed is:

1. An electrode arrangement comprising:
   a single transmitting electrode configured to generate a quasi-static alternating electric field which extends into an observation area;
   a first receiving electrode extending in a first direction and configured to be connected to an evaluation device as a receiving electrode;
   a second receiving electrode extending in a second direction different from the first direction, wherein the single transmitting electrode covers or surrounds at least an area defined by the first and second receiving electrodes;
   wherein for evaluating disturbances of the quasi-static alternating electric field caused by an object entering the electric field without touching the electrode arrangement, an enhanced sensitivity profile is obtained by combining signals from the first and second receiving electrodes to generate an electrode signal having the enhanced sensitivity profile.

2. The electrode arrangement according to claim 1, wherein the first and second receiving electrodes are combined by capacitively coupling the second receiving electrode with the first receiving electrode wherein the second receiving electrode is electrically floating or has a high impedance.

3. The electrode arrangement according to claim 2, wherein the capacitive coupling is realized by a discrete capacitor connected between the first and second receiving electrode.

4. The electrode arrangement according to claim 2, wherein the capacitive coupling is realized by a capacitive coupling path between the first and second receiving electrodes.

5. The electrode arrangement according to claim 1, wherein the first receiving electrode generates a first receiving signal and the second receiving electrode generates a second receiving signal and wherein the first and second signals are summed with controllable individual weights.

6. The electrode arrangement according to claim 1, wherein the single transmitting electrode is arranged in a layer under the first and second receiving electrodes and being configured to generate the quasi-static electric field which is received by the first and second receiving electrodes.

7. The electrode arrangement according to claim 6, wherein the first and second receiving electrodes are arranged in different layers above the single transmitting electrode.

8. The electrode arrangement according to claim 1, comprising
   a plurality of parallel arranged first electrodes comprising the first receiving electrode;
   a plurality of parallel arranged second electrodes arranged perpendicular to the first receiving electrode and comprising said second receiving electrode,
   wherein first and second electrodes form a matrix.

9. The electrode arrangement according to claim 8, wherein each receiving electrode comprises a plurality of electrode segments connected in series.

10. The electrode arrangement according to claim 9, wherein each segment has the shape of a diamond.

11. The electrode arrangement according to claim 9, wherein each segment has the shape of a rhombus.

12. The electrode arrangement according to claim 9, wherein the plurality of parallel arranged first and second electrodes each comprise inner electrodes and outer electrodes, and wherein the outer electrodes form main receiving electrodes which are electrically connected with an evaluation device.

13. The electrode arrangement according to claim 12, wherein an outer electrode is capacitively coupled with inner electrodes that are arranged perpendicular to the outer electrode wherein the capacitive coupling between electrode segments of the inner electrodes is different to the respective capacitive coupling between the electrode segments of the inner electrodes and the outer electrode.

14. The electrode arrangement according to claim 12, wherein adjacent electrode segments of said plurality of parallel arranged first and second electrodes have a capacitive coupling defined by a distance between respective electrode segments and a first distance between the electrode segments of an outer electrode and the electrode segments of inner electrodes that are adjacent to the electrode segments of the outer electrode is different to a second distance between remaining adjacent electrode segments.

15. The electrode arrangement according to claim 12, wherein the plurality of parallel arranged first and second electrodes are arranged in different layers above the single transmitting electrode and wherein electrode segments of an outer electrode overlap partially with electrode segments of the inner electrodes being arranged perpendicular to the respective outer electrode.

16. The electrode arrangement according to claim 9, further comprising floating electrode segments arranged in spaces defined by the matrix.

17. The electrode arrangement according to claim 8, wherein the plurality of parallel arranged first and second electrodes each comprise inner electrodes and outer electrodes, and wherein the outer electrodes form receiving electrodes and the inner electrodes are each formed by a plurality of electrode segments connected in series.

18. The electrode arrangement according to claim 17, wherein each segment has the shape of a diamond.

19. The electrode arrangement according to claim 17, wherein each segment has the shape of a rhombus.

20. The electrode arrangement according to claim 17, wherein the first and second electrodes are arranged in different layers above the single transmitting electrode.

21. A system comprising an electrode structure capable of evaluating three dimensional gestures and touching, comprising:
a controller having at least a first, second and third port, and
wherein the electrode structure comprises:
a single transmit electrode coupled with the first port;
a first electrode extending in a first direction and being coupled with the second port; and
a second electrode extending in a second direction different from said first direction and being coupled with the third port, wherein the second electrode is arranged with respect to the first electrode to provide for a capacitive coupling between the first and second electrode, and
wherein the single transmitting electrode covers or surrounds at least an area defined by the first and second receiving electrodes;
wherein the controller is configured to operate in either a first or a second operating mode, and wherein in a first operation mode:
the first port of the controller is configured to drive the transmit electrode to generate an alternating electric field;
the second port of the controller is configured to connect the first electrode with a detection unit for evaluating a signal received from said transmit electrode; and
the third port of the controller is configured to be in a high impedance state or electrically floating, wherein the capacitive coupling between the first and second electrode is chosen such that signals from the first electrode have a sensitivity profile which is enhanced by the second electrode;
and wherein in a second operation mode:
the second and third port of the controller are configured to couple the first and second electrode with a capacitance measurement unit.

22. The system according to claim 21, further comprising a plurality of third electrodes extending in the second direction.

23. The system according to claim 22, further comprising a plurality of second electrodes extending in the first direction, wherein first and second electrodes are arranged in a matrix.

24. The system according to claim 23, further comprising a multiplexer unit for selectively coupling one of the pluralities of second electrodes and one of the pluralities of third electrodes with said capacitance measurement unit when operating in said second mode.

25. The system according to claim 22, further comprising a multiplexer unit operable to either disconnect the pluralities of third electrodes from said controller or switch a ports connected with the pluralities of third electrodes into a high impedance state.

26. An electrode matrix structure for use in a three-dimensional positioning and gesture sensor arrangement and/or a projected capacitive touch sensor arrangement, comprising:
a first layer comprising a single transmit electrode;
a second layer comprising electrode elements arranged in a plurality of rows and columns, wherein the electrode elements of each row and each column are connected to each other such that each row and column define a separate electrode line, respectively wherein the outer electrode lines define a left and right vertical electrode and a upper and lower horizontal electrode and wherein inner electrode lines formed by the inner rows and columns are arranged with respect to the left, right, upper, and lower horizontal electrodes such that the inner vertical electrode lines are capacitively coupled to the upper and lower electrodes to enhance the sensitivity of the upper and lower electrode lines and the inner horizontal electrode lines are capacitively coupled to the left and right electrodes to enhance the sensitivity of the left and right electrode lines, wherein the single transmit electrode covers or surrounds at least an area defined by the plurality of rows and columns, wherein a distance between electrode segments of the left or right electrode line and adjacent segments of an inner horizontal electrode line or a distance between electrode segments of the upper or lower electrode line and adjacent segments of an inner vertical electrode line is different than a distance between adjacent electrode segments of the inner vertical and horizontal electrode lines.

27. The electrode matrix according to claim 26, wherein electrode elements surrounded by the left and right vertical electrode and the upper and lower horizontal electrode are smaller than electrode elements of the left and right vertical electrode and the upper and lower horizontal electrode.

28. The electrode matrix according to claim 26, wherein each electrode of the matrix is rhombus shaped.

29. The electrode matrix according to claim 26, wherein each electrode of the matrix is diamond shaped.

30. The electrode matrix according to claim 26, comprising a third layer arranged between the first and second layer, wherein horizontal electrode lines are arranged in the second layer and vertical electrode lines are arranged in the third layer.

31. The electrode matrix according to claim 26, comprising a third layer arranged between the first and second layer, wherein vertical electrode lines are arranged in the second layer and horizontal electrode lines are arranged in the third layer.

32. The electrode matrix according to claim 26, comprising floating electrodes in spaces formed by said rows and columns.

* * * * *